United States Patent
Hayden et al.

[11] Patent Number: 6,019,271
[45] Date of Patent: Feb. 1, 2000

[54] METHOD FOR ULTRASONIC BONDING FLEXIBLE CIRCUITS

[75] Inventors: Brian John Hayden, Royal Oak; Cuong Van Pham, Northville; Rosa Lynda Nuno, Canton; Mark Stephen Topping, Lincoln Park, all of Mich.

[73] Assignee: Ford Motor Company, Dearborn, Mich.

[21] Appl. No.: 08/893,714

[22] Filed: Jul. 11, 1997

[51] Int. Cl.[7] .............................. B23K 1/06; B23K 31/02; B32B 31/16; H05K 1/16

[52] U.S. Cl. .................................. 228/110.1; 228/180.5; 174/261; 156/73.2; 156/290; 156/380.4; 156/309.6

[58] Field of Search .................................. 228/110.1, 1.1, 228/180.5; 156/73.1, 73.2, 290, 380.4, 309.6, 580.1; 174/117 F, 117 FF, 250, 261, 268

[56] References Cited

U.S. PATENT DOCUMENTS

| | | |
|---|---|---|
| 3,300,851 | 1/1967 | Lodder . |
| 3,384,958 | 5/1968 | Christian et al. . |
| 3,670,394 | 6/1972 | Daniels et al. . |
| 3,791,028 | 2/1974 | Missel . |
| 4,028,798 | 6/1977 | Bechard et al. . |
| 4,095,101 | 6/1978 | Lemelson ........................... 250/227.11 |
| 4,524,898 | 6/1985 | Renshaw ................................. 228/1.1 |
| 4,554,033 | 11/1985 | Dery et al. . |
| 4,589,584 | 5/1986 | Christiansen et al. . |
| 4,735,847 | 4/1988 | Fujiwara et al. ........................ 428/209 |
| 4,815,981 | 3/1989 | Mizuno .................................... 439/77 |
| 5,309,634 | 5/1994 | Van Order et al. . |
| 5,354,392 | 10/1994 | Santo et al. . |
| 5,457,057 | 10/1995 | Nath et al. ................................ 438/67 |
| 5,511,719 | 4/1996 | Miyake et al. .......................... 228/106 |
| 5,785,786 | 7/1998 | Suzuki et al. .......................... 156/73.1 |

*Primary Examiner*—Patrick Ryan
*Assistant Examiner*—Carlos J. Gamino
*Attorney, Agent, or Firm*—Leslie C. Hodges

[57] ABSTRACT

A method for bonding together at least two conductive members 20, wherein each member includes at least one metallic 22 having a respective bonding area 24. At least one member has a deposition of metallic bonding material 26 attached to each respective conductor proximate each bonding area, and at least one member has a plastic element 28 attached thereto proximate each respective bonding area. The members 20 are positioned in a predetermined orientation, clamped together between an ultrasonic horn and anvil arrangement, with pressure and orthogonal ultrasonic energy being applied thereto so that each plastic element 28 is heated, which in turn melts the bonding material 26. Any plastic element material between the conductors is squeezed away therefrom and the respective conductors 22 are brought into proximity with each other so that a molten joint of bonding material physically contacts each respective conductor. The members are then held together until each joint solidifies, and then the horn and/or anvil are retracted.

16 Claims, 5 Drawing Sheets

METHOD FOR ULTRASONIC BONDING FLEXIBLE CIRCUITS

BACKGROUND OF THE INVENTION

1. Field of the Invention

The present invention relates generally to ultrasonic bonding. More particularly, the present invention relates to a method for bonding two or more conductive members using ultrasonic energy.

2. Disclosure Information

It is well known that ultrasonic energy may be used to join various materials such as plastics and metals. Typically the members to be joined are sandwiched together, placed between a tuned ultrasonic horn and an anvil, clamped together tightly by the horn and anvil with a given amount of force, excited with ultrasonic energy by oscillating the horn which tends to either melt together or intermesh the sandwiched members at least at the interface therebetween, and (if necessary) held until the melted or intermeshed members cool. Plastic members are joined together by reciprocally exciting the members in a direction generally orthogonal to the plane defined between the interfacing surfaces of the sandwiched members. (Hereinafter, this method of ultrasonic excitation shall be referred to as "reciprocal" or "orthogonal".) This causes the plastic material at the interface between the members to melt and coalesce together. Metal members, on the other hand, are joined together by exciting one of them in a direction generally tangent to their interfacing surfaces (i.e., generally parallel to the plane defined between the interfacing surfaces) while rigidly holding the other member, causing the interfacing surfaces of the metal members to shear against each other. (Hereinafter, this method shall be referred to as "shearing".) This method utilizes a type of cold-phase friction welding in which no significant melting of the metals occurs. Rather, the shearing vibration produces a scrubbing action between the interfacing metal members that disrupts the oxides at the interface therebetween, causing metal particles at the surfaces to intermingle and diffuse across their respective surface boundaries, thereby creating a strong metallurgical bond between the members.

Ultrasonic methods are often utilized in the electronics industry for various purposes, such as when bonding gold connecting wires between a chip's substrate mounting pads and the associated leads. Another electronics application which could benefit from the application of ultrasonics is the connecting of flex circuits to terminal strips or to other flex circuits. FIG. 1 shows a typical prior art application in which a flex circuit 10 is used to electrically connect two printed circuit boards (PCBs) 12. The flex circuit shown here comprises a number of metallic conductors 14 carried on or at least partially within a flexible plastic carrier or substrate 16. Each conductor is electrically and mechanically connected to a metallic terminal pad 18 at either end. Typically such connections are made by soldering, but this can be damaging to the flex circuit and/or the PCBs because of the high temperatures involved in this process, particularly if either the flex circuit substrate or PCB substrate is constructed of a low melting point plastic material.

If the flex circuit 10 has metallic wire conductors 14, then the flex circuit can be trimmed or stripped such that bare wire portions 14b are exposed, as shown in FIG. 1. Then, shearing ultrasonic motion could be used to connect the bare wires 14b to their respective metallic terminal pads 18. However, trimming the wires in this way is tedious and time-consuming, and it is often difficult to align the wires with their respective terminals since the wires are prone to bending when handled. Yet, the alternative—not trimming the wires—presents even more problems. It is difficult to use ultrasonics to bond the conductors in untrimmed flex circuits to other metallic conductors because if reciprocal ultrasonic motion is used the plastic will melt but the metal conductors may not weld or fuse together due to the absence of shearing motion, but if shearing motion is used the plastic will not melt and the metal surfaces (e.g., the wires and the terminal pads) may not achieve the intimate face-to-face contact necessary to ultrasonically bond metals. The problem is even further exacerbated if the plastic substrate is very flimsy (as is the usual case) because any shearing motion would tend to tear the substrate, or if the conductors are not wires but instead depositions of conductive ink. In addition to these problems is the drawback that once any satisfactory metal-to-metal connection might somehow be made, the joint would not be easily undoable and redoable—although this would be desirable if any repair or rework had to be done to the flex circuit, or to the PCBs or other members to which it is connected.

It would be desirable, therefore, to provide a method of connecting flex circuits and other conductive members to PCBs, to other circuit members, or to each other, without the need to trim and expose the metallic conductors. It would further be desirable if such connections could be undoable and redoable.

SUMMARY OF THE INVENTION

The present invention overcomes the disadvantages of the prior art by providing a method for ultrasonically bonding together two or more conductive members without requiring any trimming away of the members to expose their conductors. The method comprises the following steps. First, at least two conductive members are provided wherein each member includes at least one metallic conductor having a respective bonding area. At least one of the members has a deposition of metallic bonding material attached to each respective metallic conductor proximate each respective bonding area. Also, at least one of the members has a plastic element attached thereto proximate each respective bonding area. Second, the members are positioned such that each bonding area of one member juxtaposes a respective bonding area of another member in a predetermined orientation, thereby defining couplets of juxtaposed bonding areas and generally defining a plane between interfacing surfaces of the members. Third, the members are clamped together at the couplets between an ultrasonic horn and an anvil using a predetermined amount of force. Fourth, orthogonal ultrasonic energy is applied to the couplets through the horn for a predetermined amount of time and at a predetermined frequency, such that each plastic element is heated and such that each conductor is brought into proximity with another conductor at each couplet, wherein heating of each plastic element melts each deposition of bonding material so as to form a molten joint of bonding material at each couplet, wherein each molten joint physically contacts each respective conductor thereat. Fifth, the members are held together until each joint is solidified, thereby forming an assembly. And sixth, the horn and/or anvil is/are retracted from the assembly. A method is also provided for debonding a connection formed by the foregoing method of bonding.

It is an advantage of the present invention that no stripping or trimming of any plastic carrier need be done before bonding the conductors together.

It is another advantage of the present invention that the joints formed between respective conductors do not add any significant electrical resistance across the conductors.

It is a further advantage of the present invention that the joints formed between respective conductors, and between any interfacing plastic carriers, are mechanically strong.

It is yet another advantage of the present invention that the electrical and mechanical joint formed between conductors may be debonded and rebonded, thus facilitating repair and rework efforts.

These and other advantages, features and objects of the invention will become apparent from the drawings, detailed description and claims which follow.

DETAILED DESCRIPTION OF THE PREFERRED EMBODIMENTS

Figure 1:
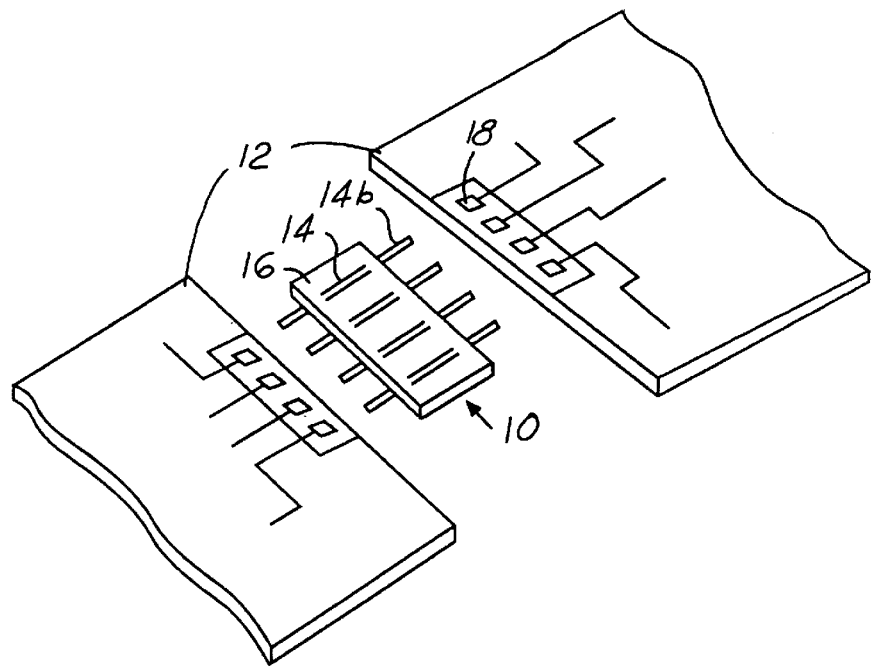
FIG. 1 is an exploded perspective view of a flex circuit connected between two PCBs according to the prior art.

Referring now to the drawings, FIGS. 2–11C illustrate various configurations for ultrasonically bonding together two or more conductive members 20 according to the present invention. Each member 20 comprises at least one metallic conductor 22 wherein each conductor has a respective bonding area 24. The bonding area 24 of each conductor is defined as that portion which will come into contact and be bonded with the bonding area 24 of another conductor 22. At least one of the members 20 has a deposition of bonding material 26 attached to each respective metallic conductor 22 proximate each respective bonding area 24, and at least one of the members 20 has a plastic element 28 attached thereto proximate each respective bonding area 24. The bonding material 26 may be made of tin, silver, lead, and/or other suitable metals, while the plastic element 28 should be made of a thermoplastic polymer. Additionally, each deposition of bonding material 26 has a melting point lower than that of each plastic element 28.

Figure 2:
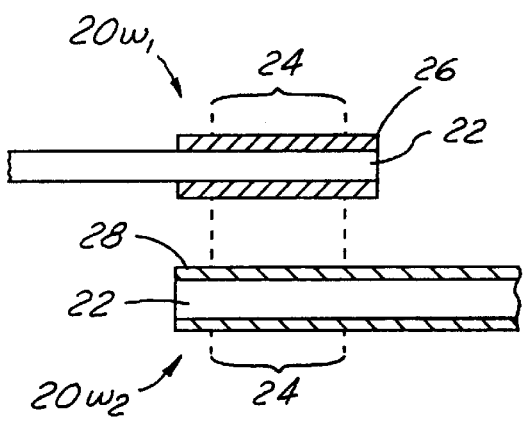
FIG. 2 is a cross-section view of two wire members according to the present invention.
Figure 3:
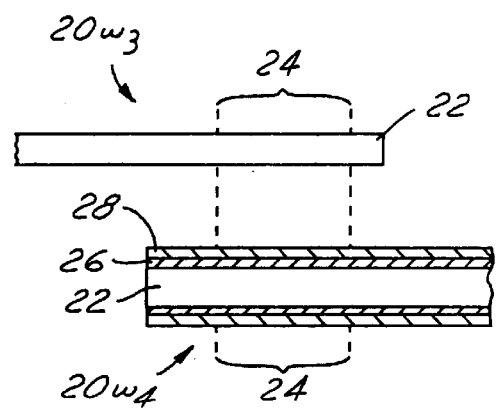
FIG. 3 is a cross-section view of an alternative arrangement of two wire members according to the present invention.

Each member 20 may be a flex circuit 20$f$, an individual wire 20$w$, a metallic mounting pad or terminal 20$t$ on a PCB, or the like, as illustrated in FIGS. 2–11C. FIG. 2 illustrates one of the simplest cases in which the conductive members are two individual wires 20$w_1$/20$w_2$. Each wire 20$w$ comprises a metallic conductor 22 having a bonding area 24 thereon, which in this case is located near an end of each wire. Here, one wire 20$w_1$, has a bonding material deposition 26 attached thereto proximate the wire's bonding area 24, and the other wire 20$w_2$ has a plastic element 28 attached thereto proximate that wire's bonding area 24. An alternative arrangement of these same elements is shown in FIG. 3, where one wire 20$w_3$ comprises only a conductor 22 having a bonding area 24, with the other wire 20$w_4$ having both the bonding material deposition 26 and the plastic element 28 attached thereto proximate that wire's bonding area 24.

Figure 4:
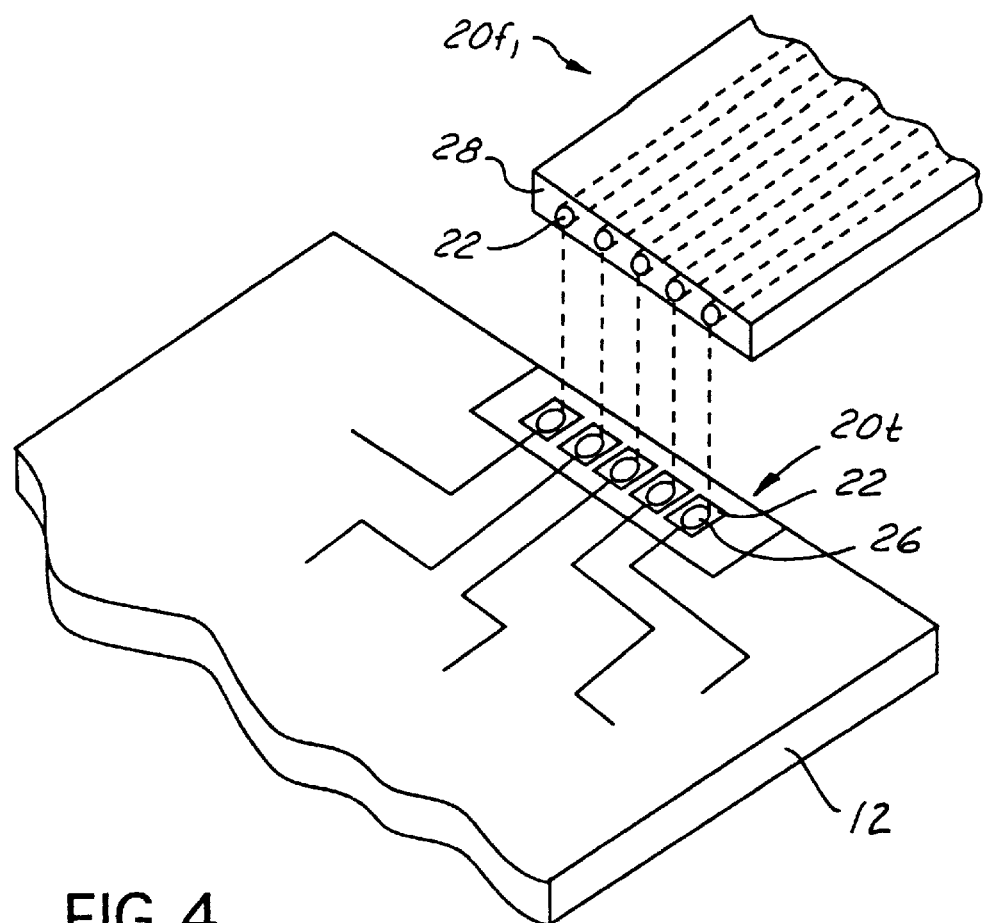
FIG. 4 is a perspective view of a flex circuit member and terminal members according to the present invention.
Figure 5:
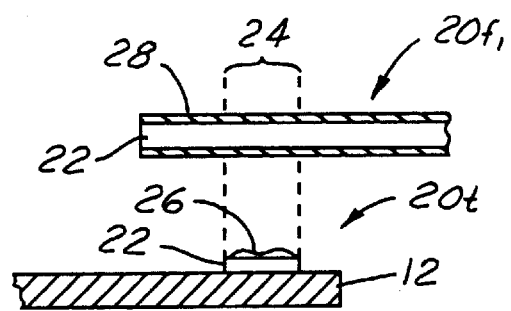
FIG. 5 is a cross-section view of the members shown in FIG. 4.
Figure 6:
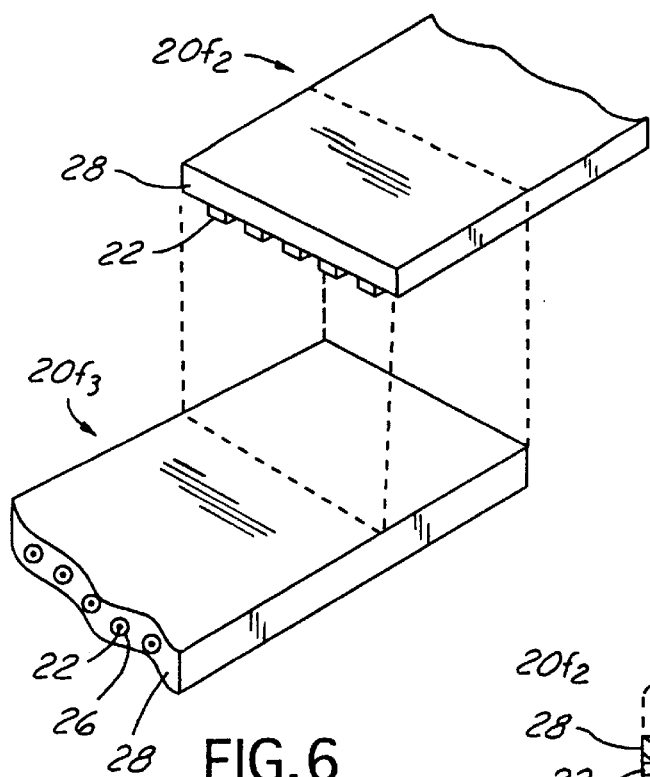
FIG. 6 is a perspective view of two flex circuit members oriented substantially coaxially with respect to each other according to the present invention.
Figure 7:
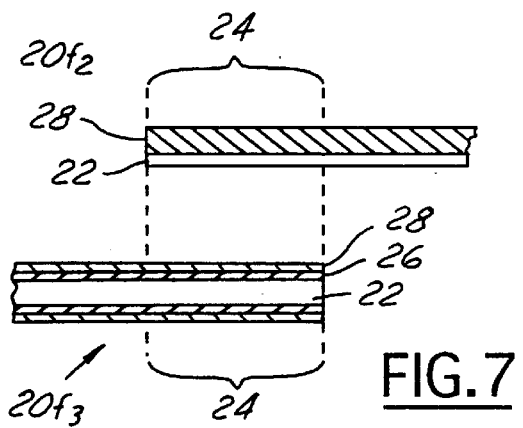
FIG. 7 is a cross-section view of the members shown in FIG. 6.
Figure 8A:
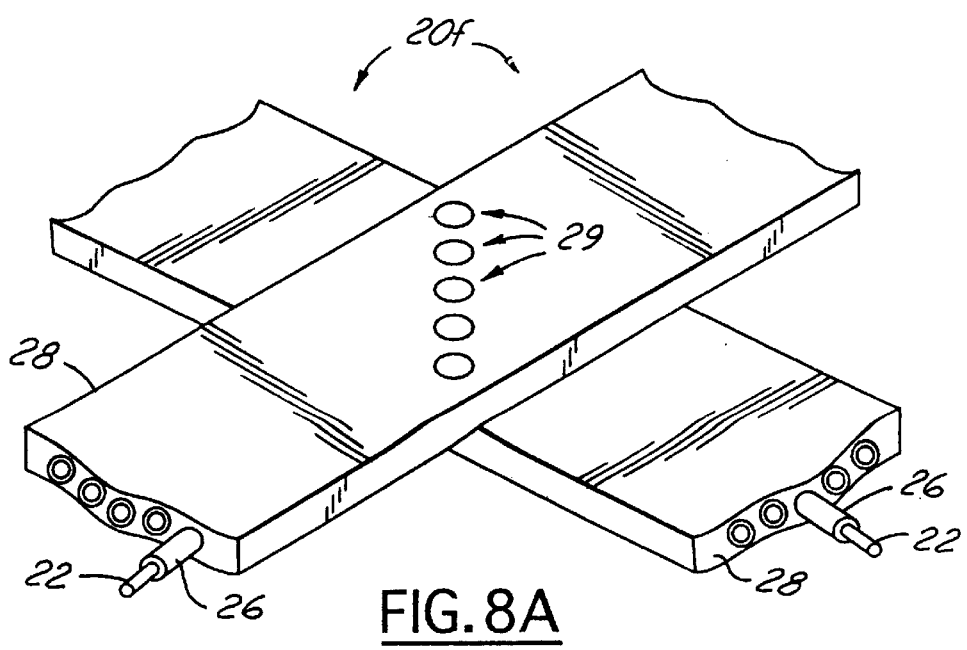
FIG. 8A is a perspective view of two flex circuit members oriented substantially orthogonally with respect to each other according to the present invention.
Figure 8B:
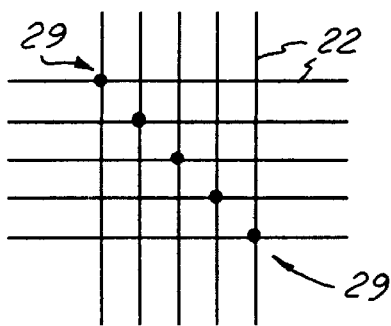
FIG. 8B is a schematic diagram of the conductors and bonding site pattern of FIG. 8A.
Figure 8C:
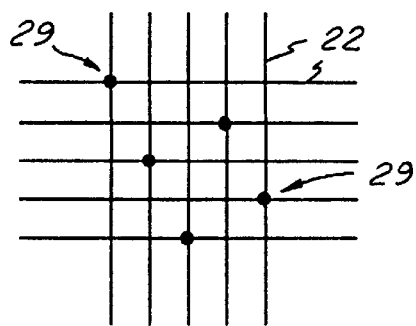
FIG. 8C is a schematic diagram of an alternative bonding site pattern according to the present invention.

Another arrangement of members 20 is illustrated in FIGS. 4 and 5, showing a PCB 12 having five mounting terminals 20$t$ and a flex circuit 20$f_1$, having five wire conductors 22 carried by a flexible plastic substrate 28. Yet another arrangement is shown in FIGS. 6 and 7, showing two flex circuit members 20$f_2$/20$f_3$ each having five conductors 22. Often the bonding area of a conductor will be located at one end of the conductor, such as when the members are oriented substantially coaxially with respect to each other as in FIGS. 2–7. However, it is also possible that a conductor's bonding area is located some distance away from either end, or even generally in the middle of conductor's length. This is often the case when the members 20 are oriented substantially orthogonally with respect to each other, as illustrated by the two flex circuit members 20$f$ in FIG. 8A. In this arrangement the bonding location 24 on each conductor 22 is different from that of each neighboring conductor. FIG. 8B shows a schematic diagram of the conductor/bonding site pattern of FIG. 8A. (As used herein, a "bonding site" 29 is defined as the location where the bonding areas 24 of two conductors 22 overlap and are to be bonded together.) One of the many possible alternative patterns for this same arrangement of conductors is illustrated in FIG. 8C. Each bonding site 29 may be bonded individually (i.e., one at a time), or two or more may be bonded simultaneously using an ultrasonic horn and anvil combination capable of selectively contacting less than all of the bonding sites and shaped to produce a desired pattern of bonding sites.

Figure 9:
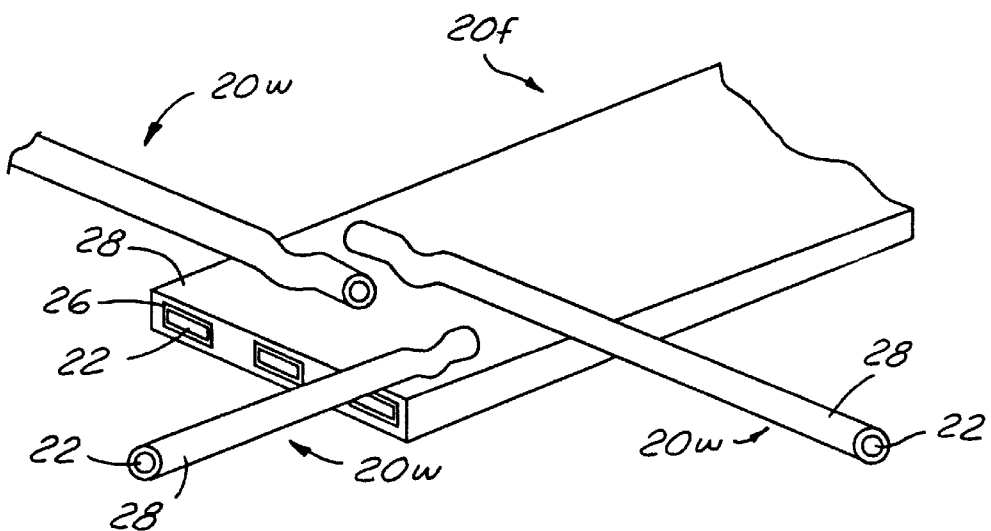
FIG. 9 is a perspective view of three wire members bonded to a flex circuit member according to the present invention.

A further arrangement is illustrated in FIG. 9, showing three wire members 20$w$ bonded to a flex circuit member 20$f$ having three conductors 22. Here, the bonding material 26 is attached the conductors of the flex circuit along their entire lengths, and the plastic elements 28 are attached along the lengths of all the members 20$f$/20$w$. This arrangement illustrates how the various members 20 may be oriented both coaxially and orthogonally within a single embodiment.

Although the deposition of bonding material 26 and the plastic element 28 need only be attached to a conductor 22 proximate the conductor's bonding area 24, it may sometimes be more practical to attach these elements 26/28 substantially along the entire surface of the conductor. This is the case for the plastic element 28 of wire member 20$w_2$ in FIG. 2, where the plastic element 28 may be a coating or sheath of insulative material. Likewise, elements 26 and 28 run around the entire circumference and along the entire length of wire member 20$w_4$, which may be a tin-coated copper wire having a plastic insulative coating.

Figure 10:
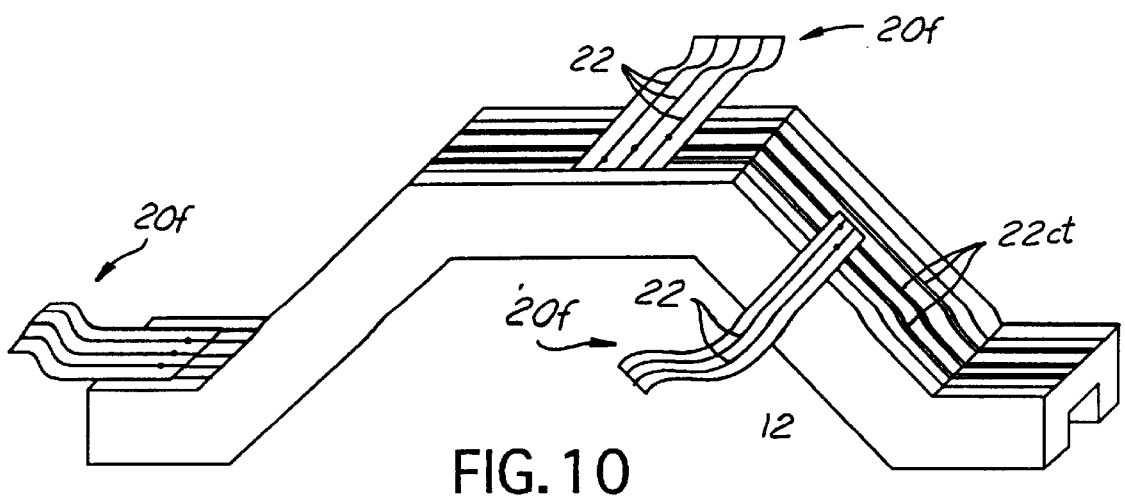
FIG. 10 is a perspective view of three flex circuit members bonded to a substrate having a non-planar surface with circuit traces thereon and therein.

One special application of the present invention is illustrated in FIG. 10, showing flex cables 20$f$ ultrasonically bonded to a plastic substrate 12 having a substantially non-planar surface carrying a plurality of circuit traces 22*ct*. The substrate may be constructed of acrylonitrile-butadiene-styrene (ABS), for example, with copper circuit traces 22*ct* electroplated thereon and/or copper wires 22*ct* embedded therein. Here, the depositions of bonding material 26 are provided as coatings about the conductors 22 of the flex circuit.

The method according to the present invention used to ultrasonically bond together the conductive members shown in FIGS. 2–10 comprises the following sequence of steps. First, at least two conductive members (as described above) are provided. Second, the members are positioned such that each bonding area of one member juxtaposes a respective bonding area of another member in a predetermined orientation, thereby defining couplets or pairs of juxtaposed bonding areas (also referred to above as "bonding sites"). As mentioned above, this orientation may be such that the members are aligned either substantially coaxially or substantially orthogonally with respect to each other. The juxtaposition of the bonding areas, and hence of the members, generally defines a plane between the interfacing surfaces of the members. Third, the members are clamped together at least at the couplets between an ultrasonic horn and a stationary anvil, using a predetermined amount of force to compress the members together. Fourth, ultrasonic energy is applied to the couplets through the horn for a predetermined amount of time and at a predetermined frequency in a direction substantially orthogonal to the aforementioned plane. This combination of pressure and ultrasonics causes each plastic element to heat up and possibly (but not necessarily) melt. If any plastic element is situated between the juxtaposed bonding areas, then the combination of heat and pressure will cause the plastic thereat to be pushed away so that each conductor is brought into proximity with another conductor at each couplet; if no plastic element is situated therebetween, then the conductors at each couplet will already be positioned in proximity with each other. In either case, the degree of proximity required is such that the heating of each plastic element melts each deposition of bonding material so as to form a molten joint of bonding material at each couplet, wherein each molten joint physically contacts each respective conductor thereat. Fifth, the members are held together until each joint is solidified, thereby forming an assembly. And sixth, the horn or anvil (or both) is/are retracted from the assembly, thus completing the process.

An additional step of preheating at least one plastic element may be conducted after the providing (first) step but before the applying (fourth) step. Preheating one or more of the members may help reduce the amount of time required to heat the plastic element(s) and thereby melt the bonding material depositions, thus reducing the overall cycle time for the process.

When constructing or selecting the conductive members 20 to be used in practicing the process steps of the present invention, care should be taken to match the plastic element 28, bonding material 26, and metallic conductor 22 materials so that not only is the melting point of the bonding material less than that of the plastic element material, but that enough current can be pumped through the assembly without melting the bonding material or plastic element during use. Thus, consideration should be given to (1) the amount of heat dissipation expected from the metallic conductor during use, along with (2) the ambient temperature seen by the entire assembly, so that the combined heat from these two sources (and any others) will not unduly weaken the joint.

Because the present invention involves only orthogonal ultrasonics, no welding occurs among any adjacent conductors 22. Rather, as mentioned above, the metallic conductors 22 are held together (or "bonded") by the bonding material which is melted by the ultrasonically heated plastic and allowed to solidify into s joint holding the adjacent conductors together at their respective bonding areas 24. Also, when the conductors and plastic elements are arranged such that a first portion of each plastic element is disposed about an outer surface of each respective conductor, and a second portion of each plastic element interfaces with a respective portion of the other plastic element (i.e., when there is one plastic element 28 or a portion thereof "above" the sandwiched conductors 22 and another plastic element 28 or portion thereof "below" the sandwich, as is the case in FIGS. 6–9), the orthogonal ultrasonic energy will cause at least the plastic element second portions to melt during the excitation step and to coalesce together once the excitation has ceased, such that a solid plastic-to-plastic mechanical joint will be formed between the plastic elements. This plastic joint adds mechanical strength to the overall member-to-member assembly, as well as serving to hermetically seal each conductor-to-conductor joint.

Figure 11A:
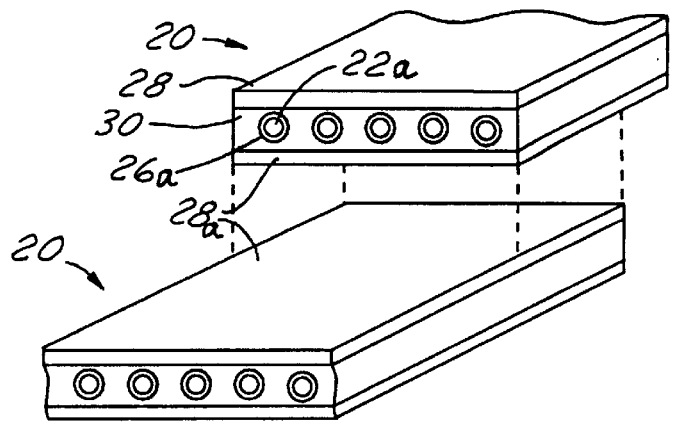
FIGS. 11A–C are perspective views of two flex circuit members bonded together according to the present invention.
Figure 11B:
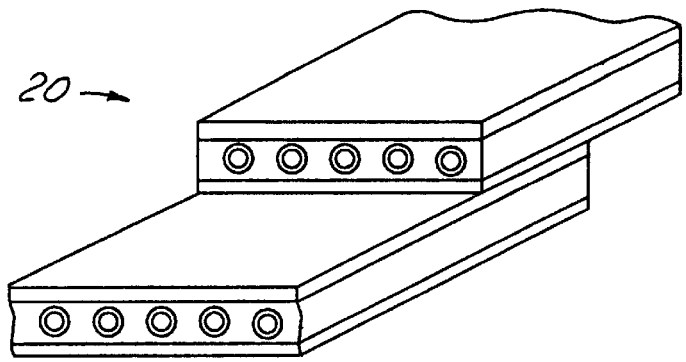
Figure 11C:
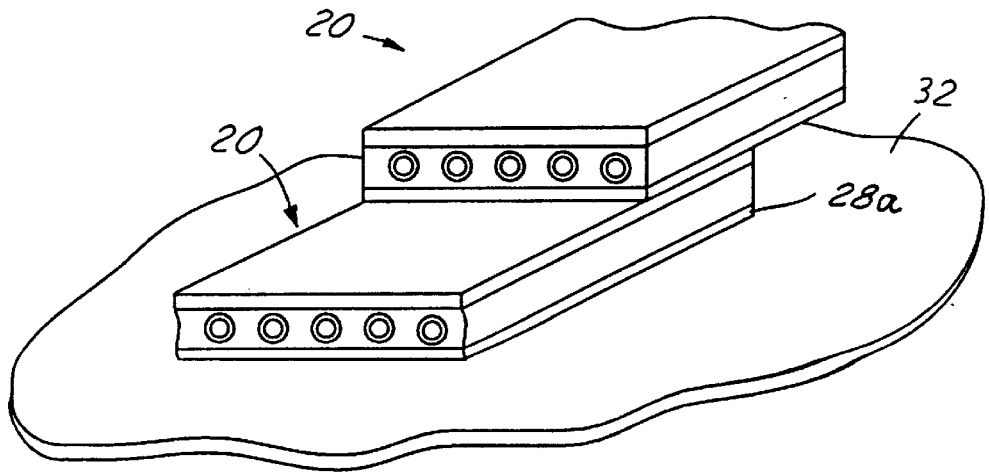

An example of a specific configuration of the present invention that was tested is shown in FIGS. 11A–C. In this configuration two flex circuit-like conductive members 20 were used, as shown in FIG. 11A. Each member 20 comprised five 120-micron-thick copper wires 22*a* having a 2 to 5 micron tin plating 26*a* on each wire, sandwiched between two 120 micron sheets of "Type A Teflon FEP" tetrafluoroethylene/hexafluoropropylene copolymer 28*a* from E.I. duPont de Nemours and Co. of Wilmington, Del. The five wires 22*a* and two plastic sheets 28*a* of each member 20 were adhered together using a 50- to 120-micron-thick layer of "Dynapol S 360" hot melt adhesive 30 from Dynamit Nobel A.G. of Troisdorf, Germany. These two members 20 were then bonded together coaxially as shown in FIG. 11B using an orthogonal ultrasonic frequency of 35 kHz, a pressure force of 80–130 p.s.i., and an excitation time of approximately 1.1 seconds. No preheating of either member was used. As the plastic was heated and melted by the orthogonal excitation, it was pushed away from the area between each pair of respective wires until the wires (and/or their tin plating) came into contact or near-contact with each other. The heat from the melted plastic also served to melt the tin plating about each wire. Once the excitation ceased and the assembly cooled, tin joints were formed between the respective wires of each pair, with the interfacing plastic layers of the two members having coalesced together. Electrical testing of this bonded assembly showed no significant difference between the electrical resistance across each pair of bonded wires as compared to that for a single wire of the same material, cross-section, and length as each bonded pair. The assembly also exhibited remarkable mechanical strength, making it very difficult to pull apart to two bonded members due to the strength of the wire-tin-wire solder-like bond and the plastic-to-plastic coalesced bond. Thus, the assembly exhibited very good electrical and mechanical joints.

A similar configuration was tested involving these same two members 20 plus a 92-mil-thick layer of ABS plastic 32, as shown in FIG. 11C. The same frequency, pressure, and time were used as in the previous example, again with no preheating of the parts. The same type of joints were produced between the two members 20, and a very strong plastic-to-plastic mechanical joint was produced between the ABS layer 32 and the adjacent Teflon FEP element 28*a*. Also, the electrical resistance across each pair of bonded wires was not significantly different from that of a single wire of the same overall length. This configuration shows how a pair of flex circuits bonded according to the present invention may be further bonded to a rigid substrate for added structural rigidity. Alternatively, it would likewise be possible to first bond a single flex circuit to a rigid substrate and then to later bond a second flex circuit thereto as needed.

As mentioned above, one advantage of the present invention is that the electrical and mechanical joint can be undone and redone, thus facilitating repair and rework efforts. A method for undoing the joint comprises the following steps. First, the previously bonded assembly of two or more conductive members is provided. This assembly comprises at least two conductive members each having at least one metallic conductor wherein each conductor has a respective bonding area. At least one of the members has a plastic element attached thereto proximate each respective bonding area. The members are arranged such that each bonding area of one member juxtaposes a respective bonding area of another member, thereby defining couplets of juxtaposed bonding areas, and each conductor is bonded to another conductor at their respective bonding areas by a solid joint of metallic bonding material. Each plastic element is made of a thermoplastic material and each joint of bonding material has a melting point lower than a melting point of said thermoplastic material. Second, the members of the assembly are clamped together at the couplets between an ultrasonic horn and an anvil using a predetermined amount of force. Third, orthogonal ultrasonic energy is applied to each couplet through the ultrasonic horn for a predetermined amount of time and at a predetermined frequency such that each plastic element is heated, wherein heating of each plastic element melts each joint of bonding material so as to form a molten joint of bonding material at each couplet. And fourth, the two conductive members are separated from each other before the bonding material solidifies. Substantially the same frequency, force, and time settings can be used in this unbonding process as was used in the previous bonding process.

Various other modifications to the present invention will, no doubt, occur to those skilled in the art to which the present invention pertains. For example, although the above example was carried out at an excitation frequency of 35 kHz, it is expected that the present invention may be practiced within a range of at least 20–70 kHz. It is the following claims, including all equivalents, which define the scope of the present invention.

What is claimed is:

1. A method for ultrasonically bonding together at least two conductive members, comprising the steps of:

providing said conductive members, wherein each member includes at least one metallic conductor having a respective bonding area, at least one of said members having a deposition of metallic bonding material attached to each respective metallic conductor proximate each respective bonding area, at least one of said members having a plastic element attached thereto proximate each respective bonding area, wherein each plastic element is made of a thermoplastic material and each deposition of bonding material has a melting point lower than a melting point of said thermoplastic material;

positioning said members such that each bonding area of one member juxtaposes a respective bonding area of another member in a predetermined orientation, thereby defining couplets of juxtaposed bonding areas and generally defining a plane between interfacing surfaces of said members;

clamping together said members at said couplets between an ultrasonic horn and an anvil using a predetermined amount of force;

applying ultrasonic energy to said couplets through said ultrasonic horn for a predetermined amount of time and at a predetermined frequency in a direction substantially orthogonal to said plane, such that each plastic element is heated and such that each conductor is brought into proximity with another conductor at each couplet, wherein heating of each plastic element melts each deposition of bonding material so as to form a molten joint of bonding material at each couplet, wherein each molten joint physically contacts each respective conductor thereat;

holding said members together until each joint is solidified, thereby forming an assembly; and retracting at least one of said ultrasonic horn and said anvil from said assembly.

2. A method according to claim 1, further comprising the step of preheating at least one conductive member after said providing step and before said applying step.

3. A method according to claim 1, wherein said predetermined amount of force is substantially in the range of 80 to 130 pounds per square inch.

4. A method according to claim 1, wherein said predetermined amount of time is substantially in the range of 0.5 to 2.0 seconds.

5. A method according to claim 1, wherein said predetermined frequency is substantially in the range of 20 to 70 kHz.

6. A method according to claim 1, wherein said deposition of bonding material is made of at least one metal selected from the group consisting essentially of tin, silver, and lead.

7. A method according to claim 1, wherein said predetermined orientation is such that said conductive members are aligned substantially coaxially with respect to each other.

8. A method according to claim 1, wherein said predetermined orientation is such that said conductive members are aligned substantially orthogonally with respect to each other.

9. A method according to claim 1, wherein at least two plastic elements are provided at each couplet, wherein said conductors and said plastic elements are arranged such that when said members are positioned during said positioning step a first portion of each plastic element is disposed about an outer surface of each respective conductor and a second portion of each plastic element interfaces with a respective portion of the other plastic element, such that each second portion melts during said applying step and coalesces with the other second portion during said holding step.

10. A method according to claim 1, wherein said plastic element is a flexible plastic substrate and wherein at least one of said conductive members comprises at least one metallic conductor carried on said plastic element.

11. A method according to claim 1, wherein said plastic element is a flexible plastic substrate and at least one of said conductive members comprises at least one metallic conductor carried at least partially within said plastic element.

12. A method according to claim 1, wherein said deposition of bonding material is disposed about a cross-sectional perimeter on at least one of said metallic conductors proximate each respective bonding area.

13. A method according to claim 1, wherein said deposition of bonding material is disposed about substantially the entire surface and along substantially the entire length of at least one of said conductors.

14. A method according to claim 1, wherein at least one of said conductive members is a wire having a coating of metallic bonding material proximate its respective bonding area.

15. A method according to claim 1, wherein at least one of said conductive members is a flex circuit comprising at least one metallic conductor carried by a flexible plastic substrate.

16. A method for ultrasonically bonding together two flex circuits, comprising the steps of:

provuing said flex circuits, wherein each includes at least one metallic conductor having a respective bonding area, at least one of said flex circuits having a deposition of metallic bonding material attached to each respective metallic conductor proximate each respective bonding area, each flex circuit having a flexible plastic carrier attached thereto proximate each respective bonding area, wherein a first portion of each plastic carrier is disposed about an outer surface of each respective conductor and a second portion of each plastic carrier interfaces with a respective portion of the other plastic carrier, wherein each plastic carrier is made of a thermoplastic material and each deposition of bonding material has a melting point lower than a melting point of said thermoplastic material;

positioning said flex circuits such that each bonding area of one flex circuit juxtaposes a respective bonding area of another flex circuit in a predetermined orientation, thereby defining couplets of juxtaposed bonding areas and generally defining a plane between interfacing surfaces of said flex circuits;

clamping together said flex circuits at said couplets between an ultrasonic horn and an anvil using a predetermined amount of force;

applying ultrasonic energy to said couplets through said ultrasonic horn for a predetermined amount of time and at a predetermined frequency in a direction substantially orthogonal to said plane, such that each plastic carrier is heated and such that each conductor is brought into proximity with another conductor at each couplet, wherein heating of each plastic carrier melts each deposition of bonding material so as to form a molten joint of bonding material at each couplet, wherein each molten joint physically contacts each respective conductor thereat;

holding said flex circuits together until each joint is solidified, thereby forming an assembly; and retracting at least one of said ultrasonic horn and said anvil from said assembly.

* * * * *